(12) United States Patent
Wang et al.

(10) Patent No.: US 11,961,716 B2
(45) Date of Patent: Apr. 16, 2024

(54) ATOMIC LAYER DEPOSITION METHOD

(71) Applicant: Industrial Technology Research Institute, Hsinchu (TW)

(72) Inventors: Hsuan-Fu Wang, Taoyuan (TW); Fu-Ching Tung, Hsinchu (TW); Ching-Chiun Wang, Miaoli County (TW)

(73) Assignee: Industrial Technology Research Institute, Hsinchu (TW)

( * ) Notice: Subject to any disclaimer, the term of this patent is extended or adjusted under 35 U.S.C. 154(b) by 64 days.

(21) Appl. No.: 17/546,053

(22) Filed: Dec. 9, 2021

(65) Prior Publication Data
US 2023/0187177 A1   Jun. 15, 2023

(51) Int. Cl.
*C23C 16/455* (2006.01)
*H01J 37/32* (2006.01)

(52) U.S. Cl.
CPC .... *H01J 37/3244* (2013.01); *C23C 16/45536* (2013.01); *C23C 16/45548* (2013.01); *C23C 16/45565* (2013.01); *H01J 37/32899* (2013.01); *H01J 37/32082* (2013.01); *H01J 2237/332* (2013.01)

(58) Field of Classification Search
CPC ... C23C 16/06; C23C 16/14; C23C 16/45536; C23C 16/45548
See application file for complete search history.

(56) References Cited

U.S. PATENT DOCUMENTS

| 8,017,182 | B2 | 9/2011 | Hendriks et al. |
| 9,466,524 | B2 | 10/2016 | Ma et al. |
| 9,719,169 | B2 | 8/2017 | Mohn et al. |

(Continued)

FOREIGN PATENT DOCUMENTS

| CN | 102414799 | 4/2012 |
| CN | 105122431 | 12/2015 |

(Continued)

OTHER PUBLICATIONS

Lee, Jaehong, et al., "Highly conductive and flexible fiber for textile electronics obtained by extremely low-temperature atomic layer deposition of Pt". NPG Asia Materials (2016) 8, e331, pp. 1-9.*

(Continued)

*Primary Examiner* — Bret P Chen
(74) *Attorney, Agent, or Firm* — JCIPRNET

(57) ABSTRACT

A deposition method including following steps is provided. A first precursor is injected into a chamber along a first direction, and a bias power supply is turned on to attract the first precursor to a substrate. A second precursor is injected into the chamber along a second direction perpendicular to the first direction, and the bias power supply is turned on to attract the second precursor to the substrate. A first inert gas is injected into the chamber along the first direction, and the bias power supply is turned off to purge an unnecessary part of the first precursor or an unnecessary part of the second precursor or a by-product. A second inert gas is injected into the chamber along the second direction, and the bias power supply is turned off to purge the unnecessary part of the first precursor or the unnecessary part of the second precursor or the by-products.

9 Claims, 20 Drawing Sheets

(56) References Cited

U.S. PATENT DOCUMENTS

| | | | |
|---|---|---|---|
| 10,679,848 B2 | 6/2020 | Kumar et al. | |
| 10,844,486 B2* | 11/2020 | Shero | H01L 21/0228 |
| 2004/0124131 A1* | 7/2004 | Aitchison | C23C 16/4402 |
| | | | 210/252 |
| 2006/0210723 A1* | 9/2006 | Ishizaka | C23C 16/45565 |
| | | | 118/723 R |
| 2007/0065594 A1 | 3/2007 | Chiang et al. | |
| 2007/0281105 A1* | 12/2007 | Mokhlesi | C23C 16/40 |
| | | | 427/569 |
| 2008/0069955 A1* | 3/2008 | Hong | C23C 16/045 |
| | | | 118/728 |
| 2008/0193643 A1* | 8/2008 | Dip | C23C 16/45551 |
| | | | 118/729 |
| 2010/0055342 A1* | 3/2010 | Chiang | H01L 21/28562 |
| | | | 427/535 |
| 2011/0086167 A1* | 4/2011 | Nunes | C23C 16/45574 |
| | | | 427/249.17 |
| 2012/0141676 A1* | 6/2012 | Sershen | C23C 16/4412 |
| | | | 118/729 |
| 2012/0156108 A1* | 6/2012 | Fondurulia | C23C 16/4401 |
| | | | 422/534 |
| 2012/0269968 A1* | 10/2012 | Rayner, Jr. | H01J 37/32449 |
| | | | 118/728 |
| 2014/0264520 A1* | 9/2014 | Reisiger | H01L 27/0288 |
| | | | 438/585 |
| 2015/0147488 A1 | 5/2015 | Choi et al. | |
| 2017/0323768 A1* | 11/2017 | Zhang | H01J 37/32082 |
| 2020/0027717 A1* | 1/2020 | Park | C23C 16/345 |
| 2020/0066607 A1 | 2/2020 | Varadarajan et al. | |

FOREIGN PATENT DOCUMENTS

| | | | | |
|---|---|---|---|---|
| CN | 107099784 | | 8/2017 | |
| CN | 107699869 | | 6/2020 | |
| JP | H0677136 | | 3/1994 | |
| JP | 2006524911 | | 11/2006 | |
| JP | 2010186885 | | 8/2010 | |
| JP | 2013197291 | | 9/2013 | |
| JP | 2016046524 | | 4/2016 | |
| JP | 2016208027 | | 12/2016 | |
| KR | 10-2009-0054930 | * | 6/2009 | H01L 21/20 |
| RU | 2555282 C2 | * | 7/2010 | C23C 16/455 |
| TW | 201700782 | | 1/2017 | |
| TW | 202042289 | | 11/2020 | |
| WO | 2020222853 | | 11/2020 | |

OTHER PUBLICATIONS

Sundberg, Pia, et al., "Organic and inorganic-organic thin film structures by molecular layer deposition: A review". Beilstein J. Nanotechnol. 2014, 5, 1104-1136.*

George, S.M., et al., "Atomic Layer Deposition for Continuous Roll-to-Roll Processing". 54th Annual Technical Conference Proceedings, Chicago, IL Apr. 16-21, 2011, pp. 76-81.*

Hatton, P, et al., "Inert gas bubble formation in magnetron sputtered thin-film CdTe solar cells." Proc. R. Soc. A 476:20200056 (2020), pp. 1-20.*

Okada, Mitsuhiro, et al., "Gas-Source CVD Growth of Atomic Layered WS2 from WF6 and H2S Precursors with High Grain Size Uniformity". Scientific Reports (2019) 9:17678, pp. 1-10.*

Elers, Kai-Erik, et al., "Film Uniformity in Atomic Layer Deposition". Chemical Vapor Deposition, 2006, 12, 13-24.*

Profijt, H.B., et al., "Substrate-biasing during plasma-assisted atomic layer deposition to tailor metal-oxide thin film growth". J. Vac. Sci. Technol. A31 (1), Jan./Feb. 2013, 01A106-1 to 01A106-9.*

Raul Zazpe et al., "Atomic Layer Deposition for Coating of High Aspect Ratio TiO2 Nanotube Layers", Langmuir, vol. 32, Issue 41, Sep. 2016, pp. 10551-10558.

M. Laudato et al., "ALD GeAsSeTe Ovonic Threshold Switch for 3D Stackable Crosspoint Memory", 2020 IEEE International Memory Workshop (IMW), May 2020, pp. 1-4.

Tae Joo Park et al., "Improved Growth and Electrical Properties of Atomic-Layer-Deposited Metal-Oxide Film by Discrete Feeding Method of Metal Precursor", Chem. Mater., vol. 23, Mar. 2011, pp. 1654-1658.

M. Brightsky et al., "Crystalline-as-Deposited ALD Phase Change Material Confined PCM Cell for High Density Storage Class Memory", 2015 IEEE International Electron Devices Meeting (IEDM), Dec. 2015, pp. 1-4.

S. Sirviö et al., "Atomic Layer Deposition of Al2O3, TiO2 and ZnO Films Into High Aspect Ratio Pores", 2007 IEEE International Solid-State Sensors, Actuators and Microsystems Conference, Jun. 2007, pp. 521-524.

"Office Action of Taiwan Counterpart Application", dated Aug. 5, 2022, p. 1-p. 10.

"Office Action of Japan Counterpart Application", dated Jul. 25, 2023, p. 1-p. 3.

"Office Action of Japan Counterpart Application", dated Dec. 12, 2023, p. 1-p. 3.

* cited by examiner

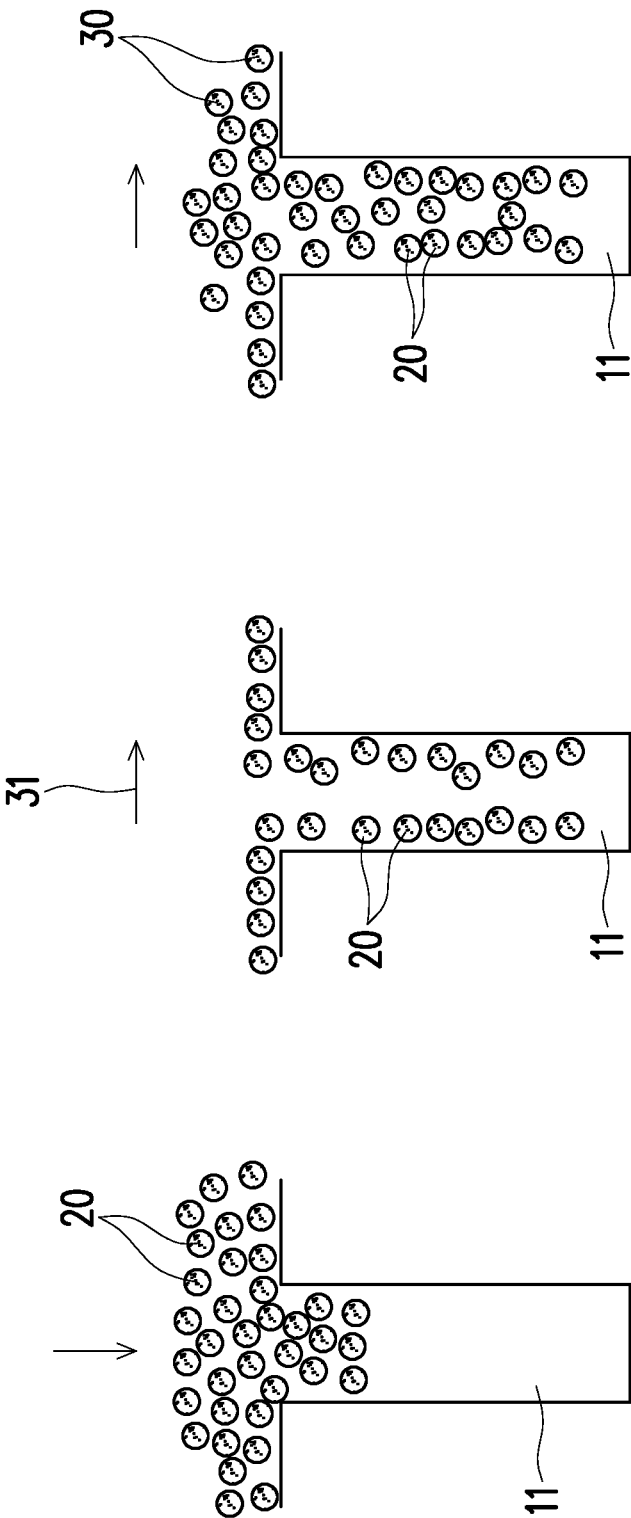

ATOMIC LAYER DEPOSITION METHOD

TECHNICAL FIELD

The disclosure relates to a deposition apparatus and a deposition method and more particularly relates to an atomic layer deposition (ALD) apparatus and an ALD method.

DESCRIPTION OF RELATED ART

Atomic layer deposition (ALD) and plasma enhanced atomic layer deposition (PEALD) are widely used in semiconductor manufacturing processes to form a conformal thin film with a uniform thickness on the entire surface of a substrate. The ALD is similar to normal chemical vapor deposition (CVD).

A substrate having a high aspect ratio structure is taken as an example. The ALD technology is to inject precursors along a horizontal direction. Although a thin film with the uniform thickness may be formed in the high aspect ratio structure, a growth rate in a vertical direction is insufficient, and thus a coating efficiency may not be improved. In contrast, the PEALD technology is to inject the precursors in the vertical direction. Although the growth rate in the vertical direction may be increased, the thickness of the film formed in the high aspect ratio structure is not uniform, and thus coating uniformity may not be improved.

SUMMARY

The disclosure provides a deposition apparatus and a deposition method, which are conducive to an improvement of coating efficiency and uniformity.

One of the embodiments of the disclosure provides a deposition apparatus adapted to perform atomic layer deposition (ALD) on a high aspect ratio structure. The deposition apparatus includes a chamber, a platform, a shower head, a bias power supply, a first injection device, and a second injection device. The platform and the shower head are disposed in the chamber, and the platform is configured to carry a substrate having the high aspect ratio structure. The bias power supply is coupled to the platform. The first injection device and the second injection device are connected to the chamber, where the first injection device is configured to inject a first precursor or a first inert gas into the chamber along a first direction through the shower head, and the second injection device is configured to inject a second precursor or a second inert gas into the chamber along a second direction perpendicular to the first direction. The first injection device and the second injection device sequentially inject the first precursor through the shower head and the second precursor into the chamber. When the first precursor or the second precursor is injected into the chamber, the bias power supply is turned on. After the first precursor or the second precursor is injected into the chamber, the first injection device injects the first inert gas into the chamber, or the second injection device injects the second inert gas into the chamber, and the bias power supply is turned off.

One of the embodiments of the disclosure provides a deposition method which includes following steps. A first precursor is injected into a chamber along a first direction, and a bias power supply is turned on to attract the first precursor to a substrate having a high aspect ratio structure. A second precursor is injected into the chamber along a second direction perpendicular to the first direction, and the bias power supply is turned on to attract the second precursor to the substrate having the high aspect ratio structure. A first inert gas is injected into the chamber along the first direction, and the bias power supply is turned off to purge an unnecessary part of the first precursor or an unnecessary part of the second precursor or a by-product. A second inert gas is injected the chamber along the second direction, and the bias power supply is turned off to purge the unnecessary part of the first precursor or the unnecessary part of the second precursor or the by-products.

Several exemplary embodiments accompanied with figures are described in detail below to further describe the disclosure in details.

BRIEF DESCRIPTION OF THE DRAWINGS

FIG. 2A to FIG. 2E are schematic partial enlarged views of a deposition process on a high aspect ratio structure according to an embodiment of the disclosure.

DETAILED DESCRIPTION OF DISCLOSED EMBODIMENTS

Figure 1A:
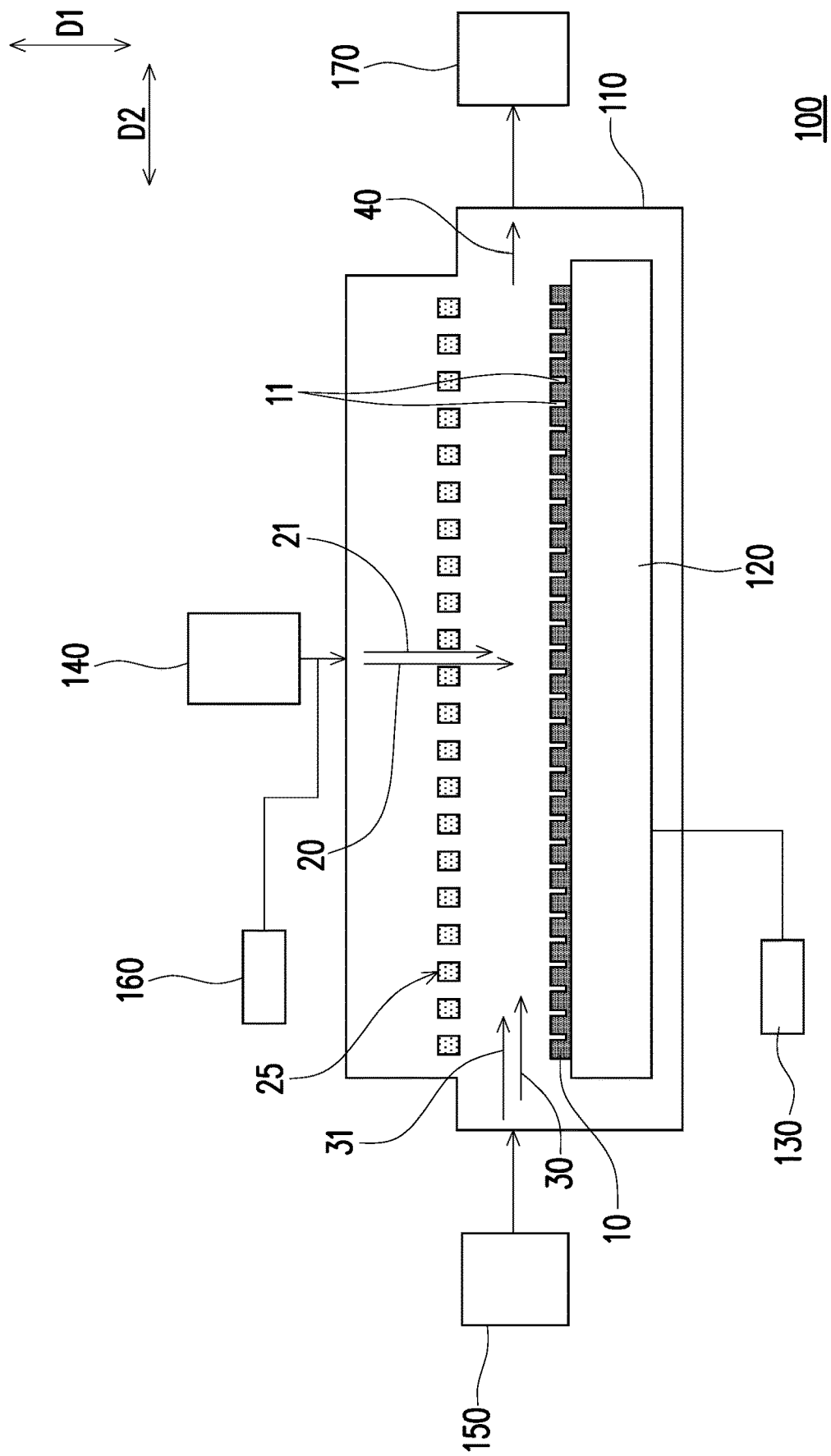
FIG. 1A to FIG. 1H are schematic views of a deposition apparatus according to a first embodiment to an eighth embodiment of the disclosure.

FIG. 1A to FIG. 1H are schematic views of a deposition apparatus according to a first embodiment to an eighth embodiment of the disclosure. With reference to FIG. 1A, in the present embodiment, a deposition apparatus 100 may be an atomic layer deposition (ALD) apparatus and may be adapted to an ALD on a high aspect ratio structure. In detail, the deposition apparatus 100 includes a chamber 110, a platform 120, a shower head 25, a bias power supply 130, a first injection device 140, and a second injection device 150, where the platform 120 is disposed in the chamber 110, and a substrate 10 is disposed on the platform 120. On the other hand, the substrate 10 has a plurality of high aspect ratio structures 11, e.g., blind holes or grooves.

The shower head 25 is, corresponding to the first injection device 140, disposed in the chamber 110 and is located above the platform 120. The first injection device 140 and the second injection device 150 are connected to the chamber 110, where the first injection device 140 is configured to inject evenly a first precursor 20 or a first inert gas 21 into the chamber 110 through the shower head 25 along a first direction D1, and the second injection device 150 is configured to inject a second precursor 30 or a second inert gas 31 into the chamber 110 along a second direction D2 perpendicular to the first direction D1. To be specific, the first precursor 20 is evenly injected into the chamber 110 along the first direction D1 (e.g., a vertical direction) through the shower head 25 and flows toward the substrate 10 to form a down stream, which is conducive to acceleration of a growth rate of a thin film in the vertical direction. In contrast, the second precursor 30 is injected into the chamber 110 along the second direction D2 (e.g., a horizontal direction) and flows through the substrate 10 to form a cross flow, which is conducive to improvement of uniformity of the thin film formed in the high aspect ratio structures 11.

In the process where the first precursor 20 is evenly injected into the chamber 110 through the shower head 25, the first precursor 20 generates chemical absorption of one single atom layer on a surface of the substrate 10 and inner wall surfaces of the high aspect ratio structures 11, so that a functional group is generated on the surface of the substrate 10 and the inner wall surfaces of the high aspect ratio structures 11, which is a first half-reaction step. In the process where the second precursor 30 is injected into the chamber 110, the second precursor 30 reacts with the functional group of the first precursor 20 located on the surface of the substrate 10 and the inner wall surfaces of the high aspect ratio structures 11 to form one single atom layer, which is a second half-reaction step.

That is, in the first half-reaction step and the second half-reaction step, the first precursor 20 and the second precursor 30 are injected along two different directions, respectively, which is not only conducive to improvement of coating efficiency but also conducive to improvement of the uniformity of the thin film formed in the high aspect ratio structures 11.

As shown in FIG. 1A, the bias power supply 130 is electrically coupled to the platform 120. When the first precursor 20 or the second precursor 30 is injected into the chamber 110, the bias power supply 130 is turned on to apply a bias to the platform 120 and the substrate 10 thereon. Under the bias action, the first precursor 20 or the second precursor 30 is attracted to substrate 10 and moved into high aspect ratio structures 11, which is conducive to the improvement of the coating efficiency and uniformity.

After the first precursor 20 or the second precursor 30 is injected into the chamber 110, the first injection device 140 injects the first inert gas 21 into the chamber 110, or the second injection device 150 injects the second inert gas 31 into the chamber 110, and the bias power supply 130 is turned off, which is conducive to purge or clear the first precursor 20 or the second precursor 30 which blocks openings of the high aspect ratio structures 11 and allowing the first precursor 20 or the second precursor 30 to fall into the high aspect ratio structures 11 smoothly.

In particular, the first inert gas 21 is injected into the chamber 110 along the first direction D1 (e.g., the vertical direction) and flows toward the substrate 10 to accelerate the process where the first precursor 20 or the second precursor 30 falls into the high aspect ratio structures 11 and is spread over the inner wall surfaces of the high aspect ratio structures 11; at the same time, an unnecessary part of the first precursor or an unnecessary part of the second precursor is purged, which is a first purge step. On the other hand, the second inert gas 31 is injected into the chamber 110 along the second direction D2 (e.g., the horizontal direction) and flows through the substrate 10 to purge or clear the first precursor 20 or the second precursor 30 which blocks openings of the high aspect ratio structures 11, which is a second purge step.

In the deposition process provided in the first embodiment, the first half-reaction step, the second purge step, the second half-reaction step, and the first purge step are sequentially performed twice.

In the deposition process provided in the second embodiment, the first half-reaction step and the second purge step are sequentially performed twice, and the second half-reaction step and the first purge step are sequentially performed twice.

In the deposition process provided in the third embodiment, the first half-reaction step, the first purge step, the second half-reaction step, and the second purge step are sequentially performed twice.

In the deposition process provided in the fourth embodiment, the first half-reaction step, the first purge step, the second half-reaction step, and the first purge step are sequentially performed, and the first half-reaction step, the second purge step, the second half-reaction step, and the second purge step are sequentially performed.

In the deposition process provided in the fifth embodiment, the first half-reaction step and the first purge step are sequentially performed twice, and the second half-reaction step and the second purge step are sequentially performed twice.

With reference to FIG. 1A, which is a schematic diagram of the deposition apparatus according to the first embodiment, the deposition apparatus 100 in this embodiment further includes a radio frequency (RF) power supply 160 and an air pumping device 170, where the RF power supply 160 is electrically coupled to the first injection device 140 or electrically coupled to the shower head 25, and the RF power supply 160 is turned on when the first precursor 20 is injected; a dissociation reaction of the first precursor 20 is accelerated by generating plasma, and the bias power supply 130 may be turned on at the same time to apply a bias to the platform 120 and the substrate 10 thereon. Under the bias action, the first precursor 20 is attracted to the substrate 10 and moved into the high aspect ratio structures 11, which is conducive to the improvement of the coating efficiency and uniformity. In addition, the air pumping device 170 is connected to the chamber 110 and generates a pumping airflow 40 in the second direction D2. After the deposition process is completely performed, the air pumping device 170 is turned on to purge the unnecessary part of the first precursor 20 and the unnecessary part of the second precursor 30 from the chamber 110.

Figure 1B:
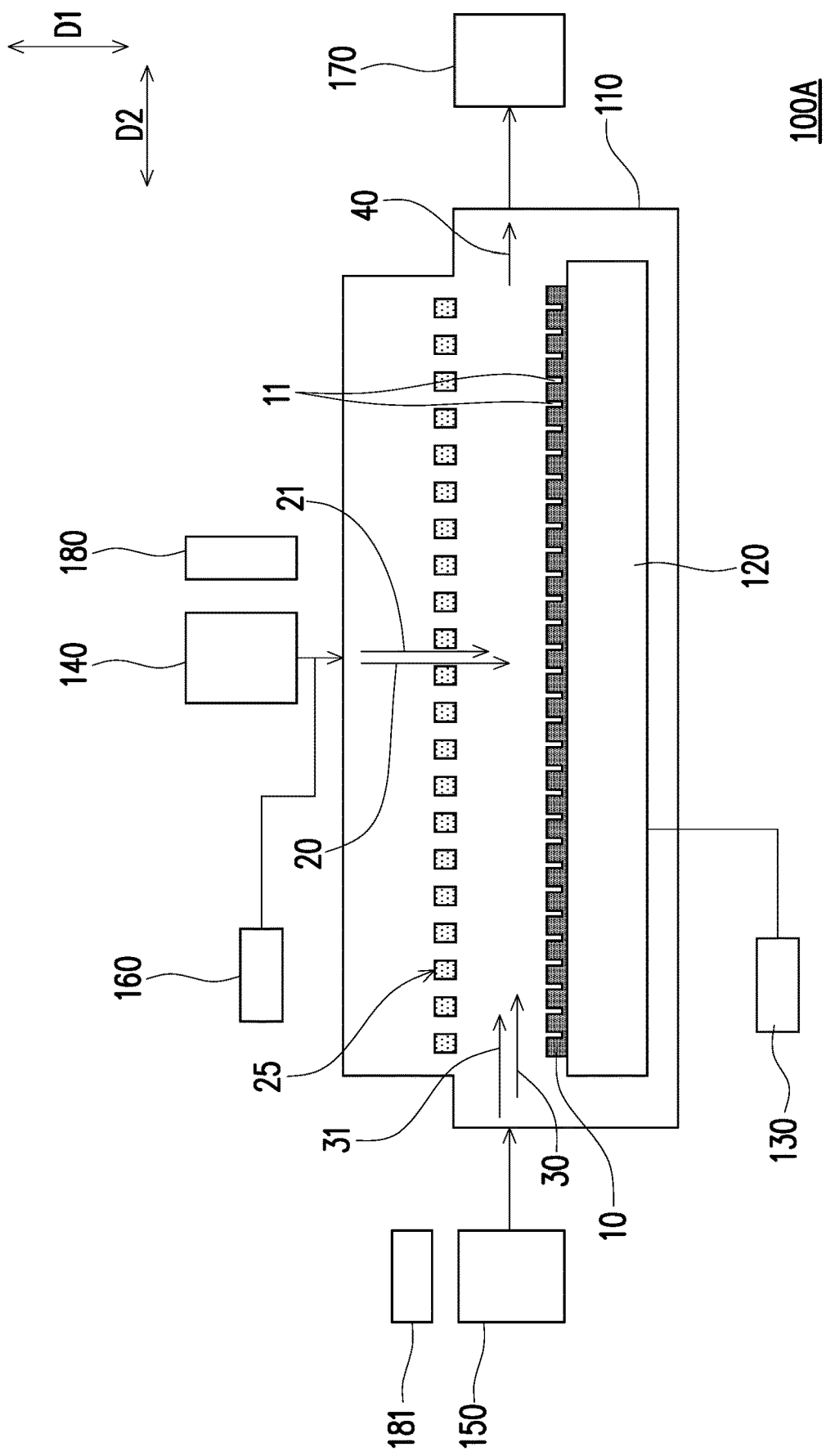

With reference to FIG. 1B, which is a schematic diagram of the deposition apparatus according to the second embodiment, a difference between a deposition apparatus 100A and the deposition apparatus 100 provided in the first embodiment depicted FIG. 1A lies in that the deposition apparatus 100A further includes a first heater 180 thermally coupled to the first injection device 140 and a second heater 181 thermally coupled to the second injection device 150. To be specific, when the first precursor 20 is injected into the chamber 110, the first heater 180 is turned on and heats the first precursor 20 to provide energy required the reaction of the first precursor 20. In addition, when the second precursor 30 is injected into the chamber 110, the second heater 181 is turned on and heats the second precursor 30 to provide energy required for the reaction of the second precursor 30.

Figure 1C:
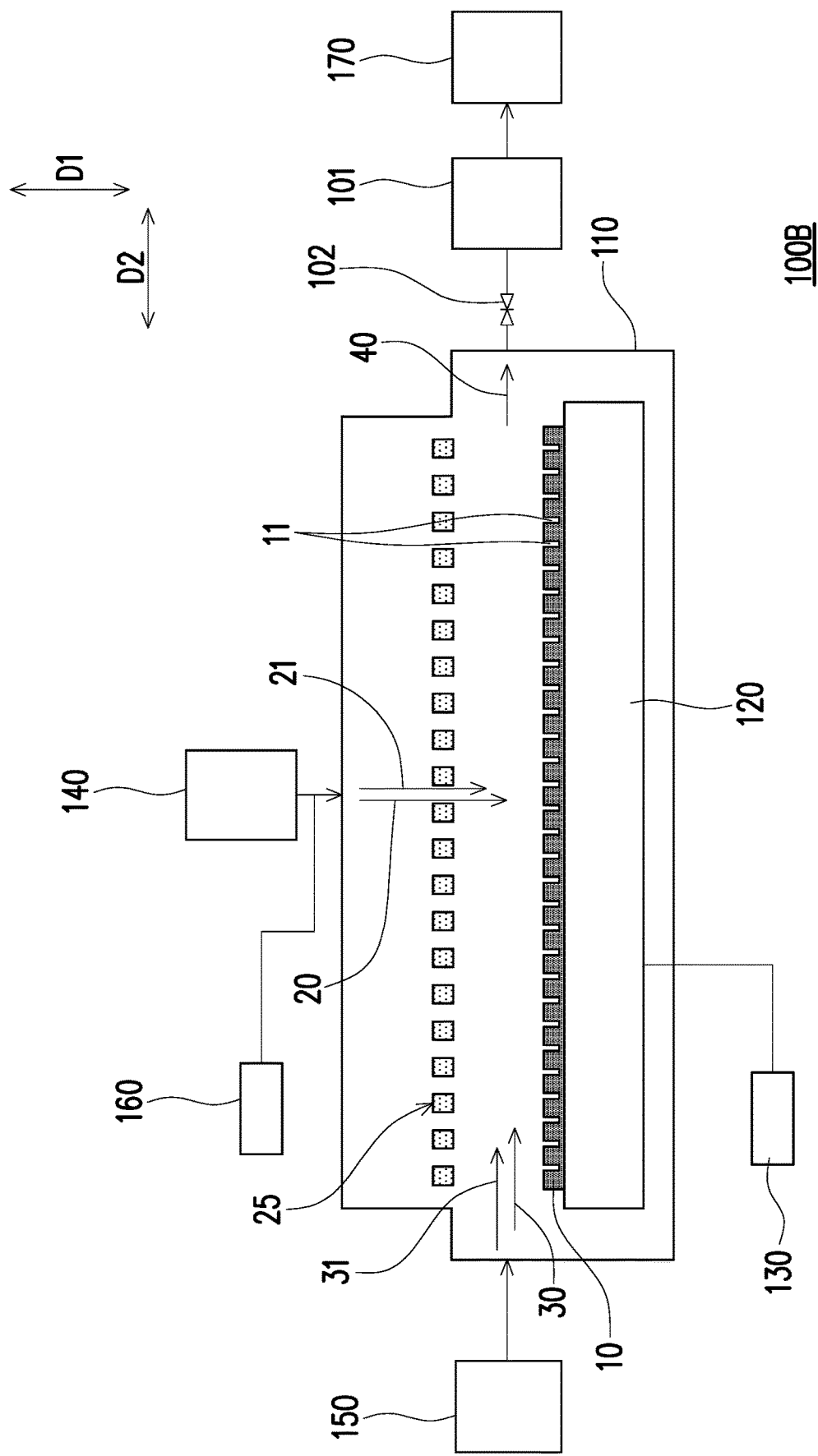

With reference to FIG. 1C, which is a schematic diagram of the deposition apparatus according to the third embodiment, a difference between a deposition apparatus 100B and the deposition apparatus 100 provided in the first embodiment depicted FIG. 1A lies in that the deposition apparatus 100B further includes a low-pressure chamber 101 connected to the chamber 110, where the air pumping device 170 is connected to the low-pressure chamber 101, and the air pumping device 170 performs air pumping on the low-pressure chamber 101, so that the low-pressure chamber 101 remains in a state approaching the vacuum state, e.g. $10^{-4}$ torr.

To be specific, the air pumping device 170 is indirectly connected to the chamber 110 through the low-pressure chamber 101, and a pressure of the low-pressure chamber 101 is lower than a pressure of the chamber 110. In other words, there is a pressure difference between the chamber 110 and the low-pressure chamber 101. In particular, the deposition apparatus 100B further includes a valve 102 disposed between the chamber 110 and the low-pressure chamber 101. During the deposition process, the valve 102 is turned off. After the deposition process is completely performed, the valve 102 is turned on to communicate the chamber 110 and the low-pressure chamber 101 and generate a pumping airflow 40 in the second direction D2, so as to quickly purge the unnecessary part of the first precursor 20 and the unnecessary part of the second precursor 30 from the chamber 110.

Figure 1D:
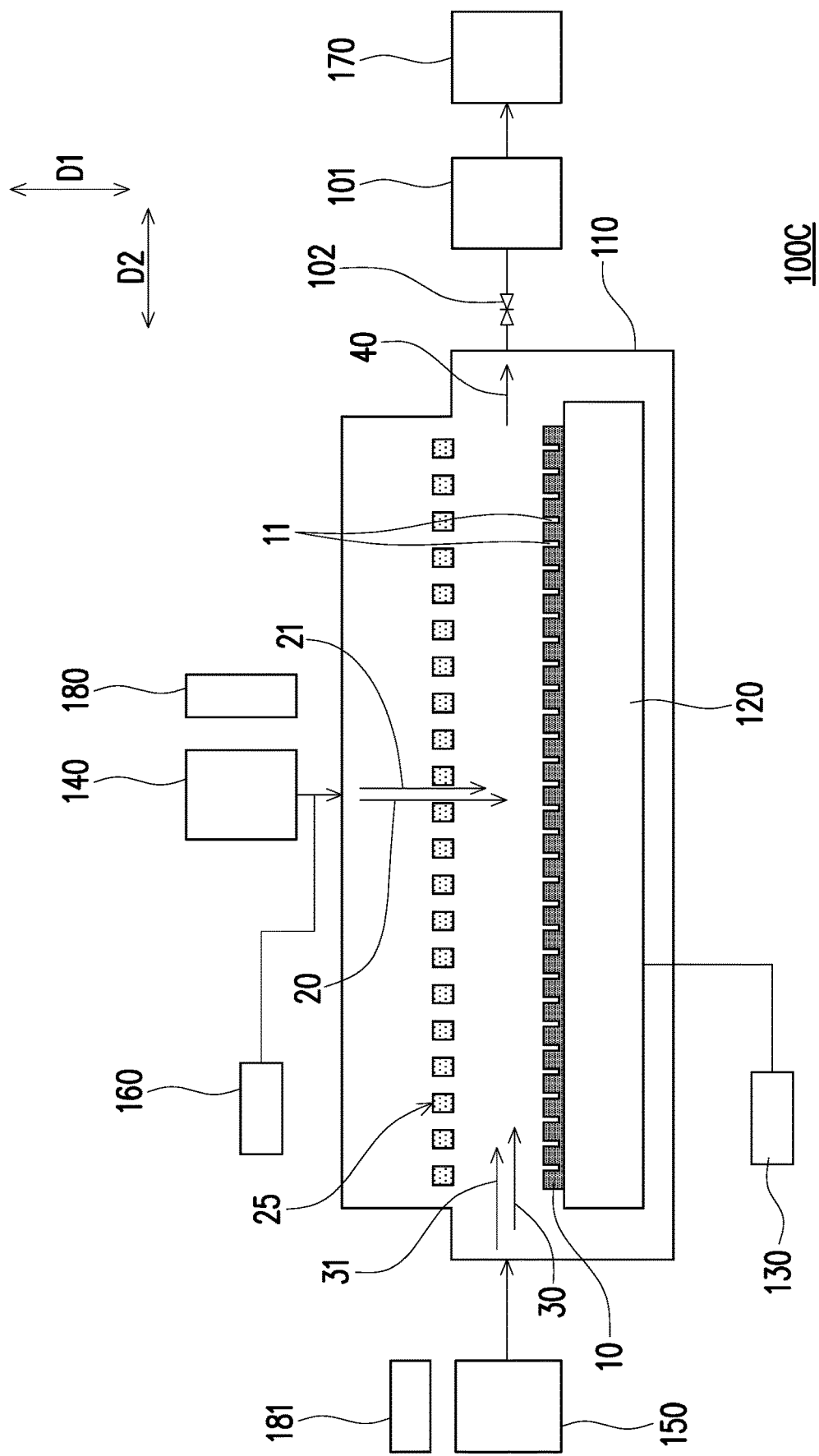

With reference to FIG. 1D, which is a schematic diagram of the deposition apparatus according to the fourth embodiment, a difference between a deposition apparatus 100C and the deposition apparatus 100B provided in the third embodiment depicted FIG. 1C lies in that the deposition apparatus 100C further includes the first heater 180 thermally coupled to the first injection device 140 and the second heater 181 thermally coupled to the second injection device 150. The deposition apparatus 100C has the low-pressure chamber 101 connected to the chamber 110, and when the first precursor 20 is injected into the chamber 110, the first heater 180 is turned on and heats the first precursor 20 to provide energy required for the reaction of the first precursor 20. In addition, when the second precursor 30 is injected into the chamber 110, the second heater 181 is turned on and heats the second precursor 30 to provide the energy required for the reaction of the second precursor 30.

Figure 1E:
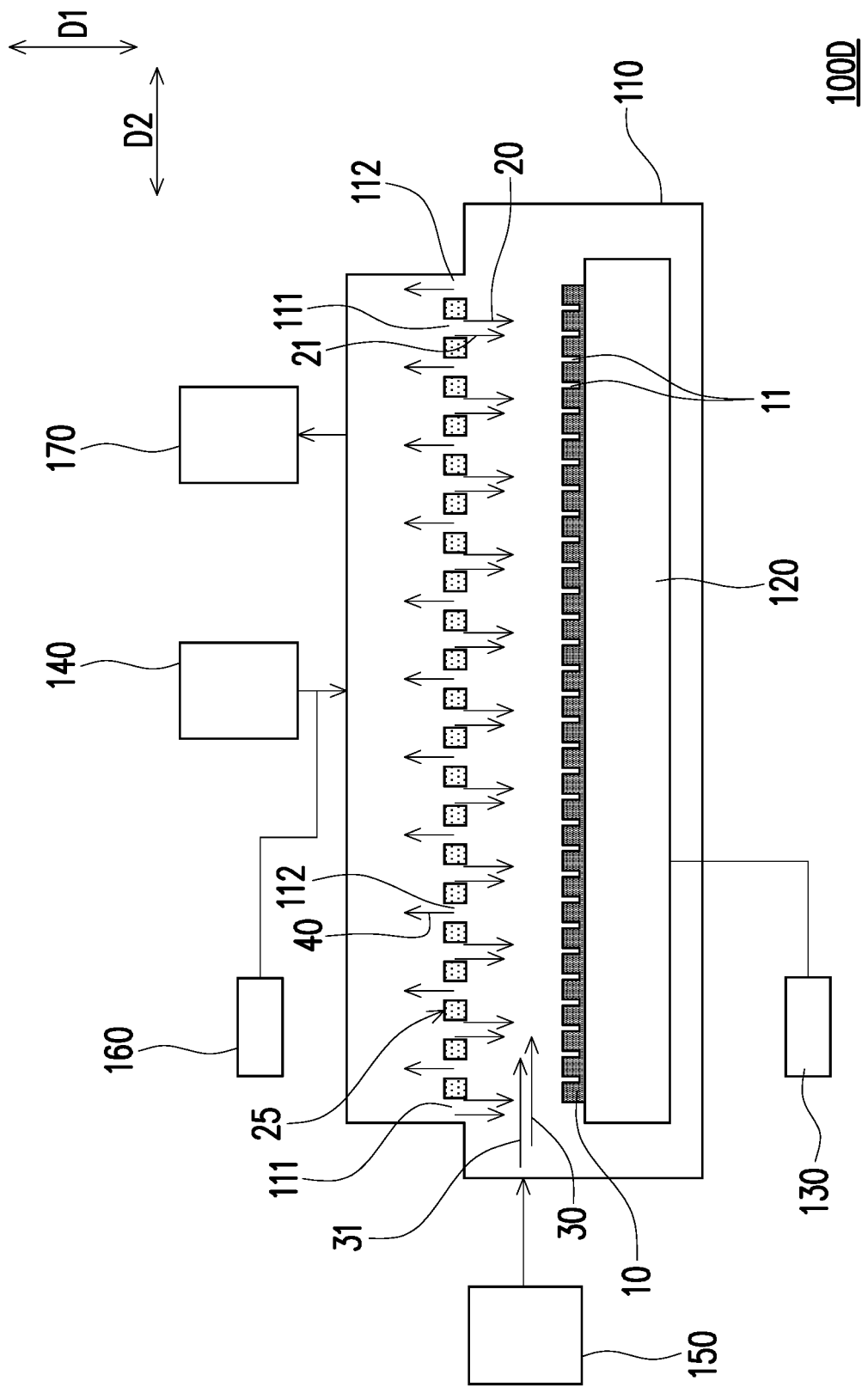

With reference to FIG. 1E, which is a schematic diagram of the deposition apparatus according to the fifth embodiment, a difference between a deposition apparatus 100D and the deposition apparatus 100 provided in the first embodiment depicted FIG. 1A lies in the arrangement of a flow path of the first precursor 20 and the pumping airflow 40. In the present embodiment, a plurality of air feeding channels 111 and a plurality of air pumping channels 112 are alternately arranged within the chamber 110, and the air feeding channels 111 and the air pumping channels 112 are located above the platform 120. In the present embodiment, the air feeding channels 111 and the air pumping channels 112 are located between the first injection device 140 and the platform 120.

In detail, the first injection device 140 is connected to the air feeding channels 111, and the first precursor 20 flows toward the substrate 10 through the air feeding channels 111. On the other hand, the air pumping device 170 is connected to the air pumping channels 112 to generate the pumping airflow 40 in the first direction D1. After the deposition process is completely performed, the air pumping device 170 is turned on to purge the unnecessary part of the first precursor 20 and the unnecessary part of the second precursor 30 from the chamber 110.

Figure 1F:
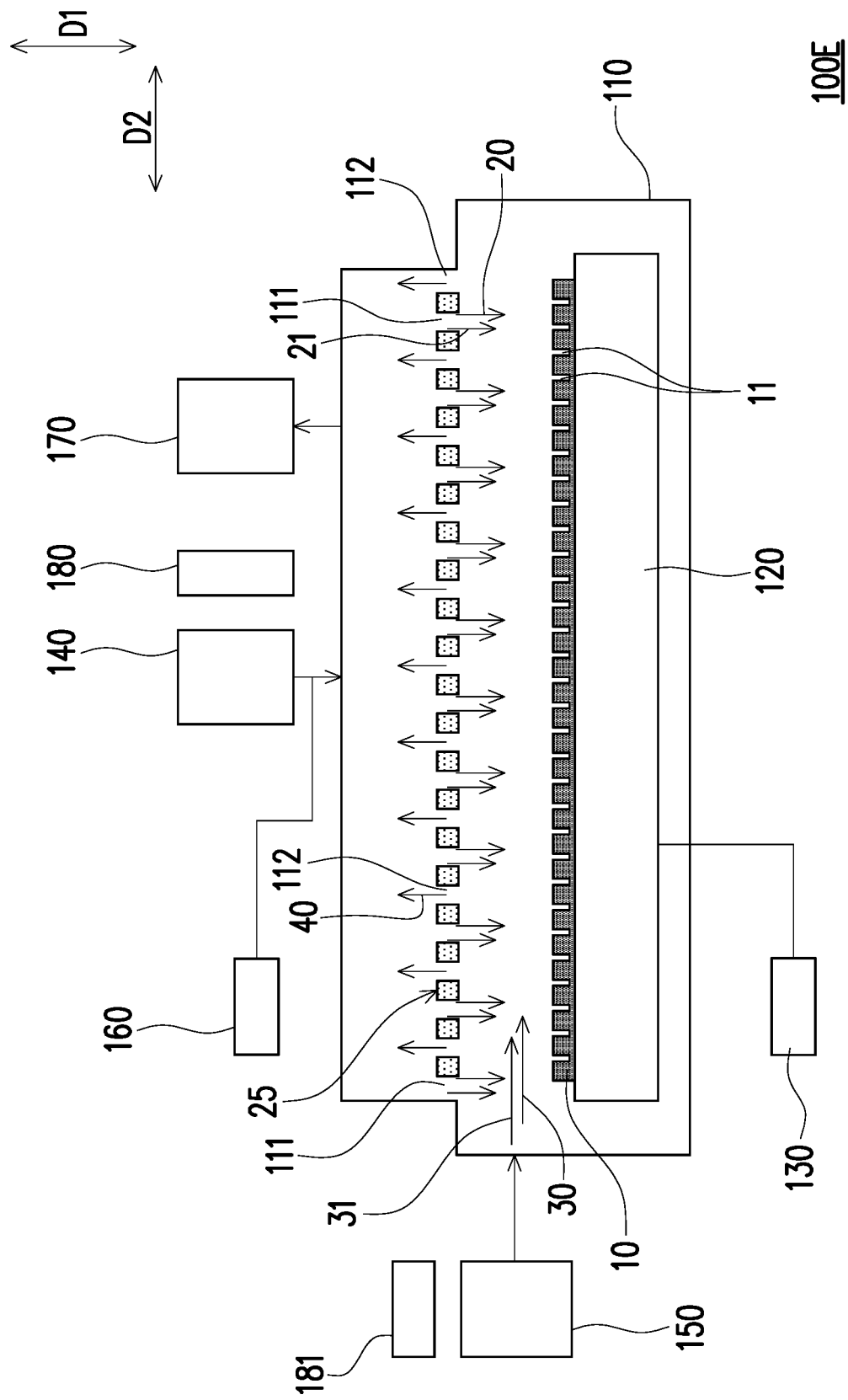

With reference to FIG. 1F, which is a schematic diagram of the deposition apparatus according to a sixth embodiment, a difference between a deposition apparatus 100E and the deposition apparatus 100D provided in the fifth embodiment depicted FIG. 1E lies in that the deposition apparatus 100E further includes the first heater 180 thermally coupled to the first injection device 140 and the second heater 181 thermally coupled to the second injection device 150. To be specific, when the first precursor 20 is injected into the chamber 110, the first heater 180 is turned on and heats the first precursor 20 to provide energy required for the reaction of the first precursor 20. In addition, when the second precursor 30 is injected into the chamber 110, the second heater 181 is turned on and heats the second precursor 30 to provide the energy required for the reaction of the second precursor 30.

Figure 1G:
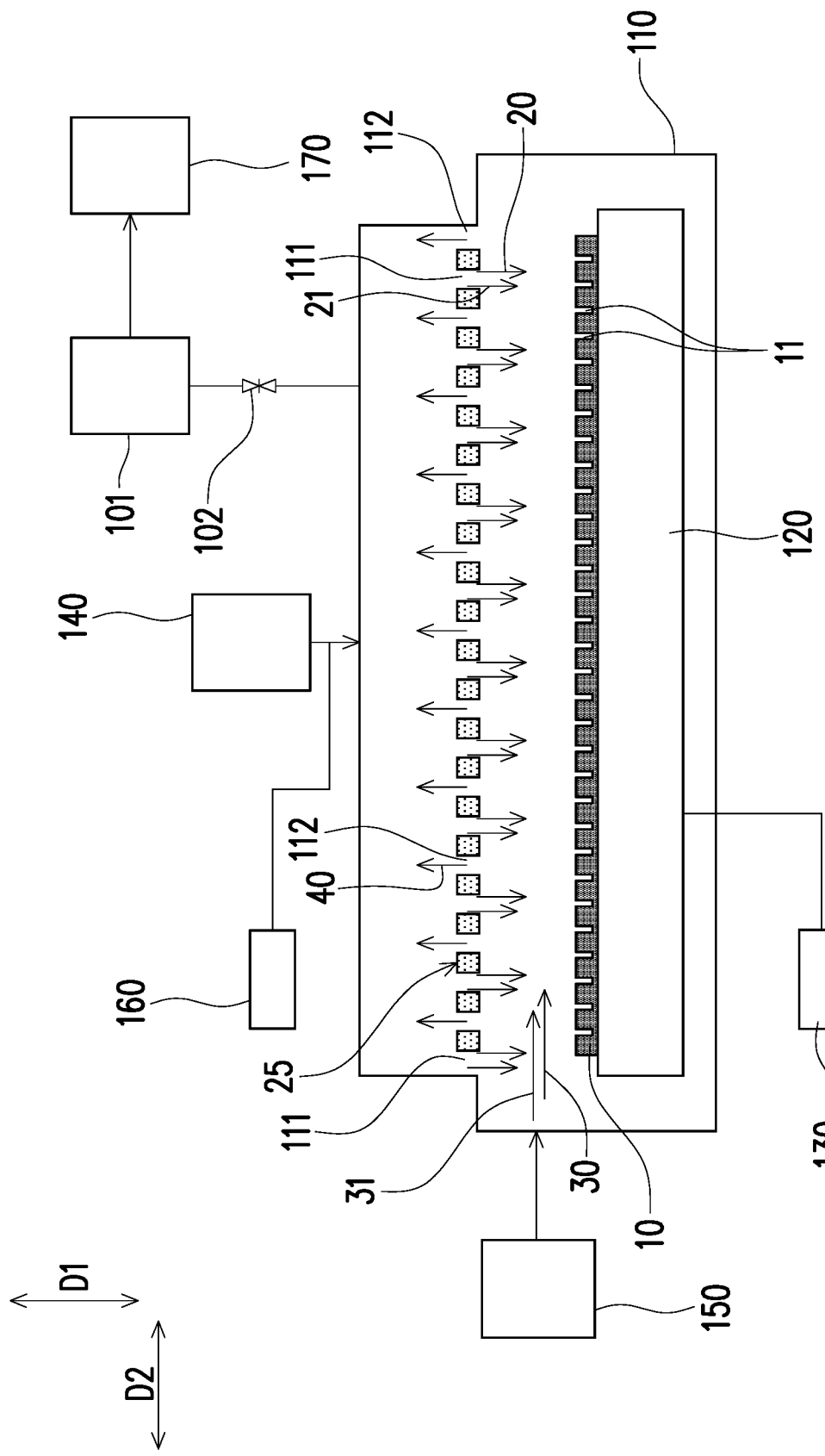

With reference FIG. 1G, which is a schematic diagram of the deposition apparatus according to a seventh embodiment, a difference between a deposition apparatus 100F and the deposition apparatus 100D provided in the fifth embodiment depicted FIG. 1E lies in that the deposition apparatus 100F further includes the low-pressure chamber 101 connected to the chamber 110, where the air pumping device 170 is connected to the low-pressure chamber 101, and the air pumping device 170 performs air pumping on the low-pressure chamber 101, so that the low-pressure chamber 101 stays in a state approaching the vacuum state, e.g., $10^{-4}$ torr.

To be specific, the air pumping device 170 is indirectly connected to the chamber 110 through the low-pressure chamber 101, and the pressure of the low-pressure chamber 101 is lower than the pressure of the chamber 110. That is, there is a pressure difference between the chamber 110 and the low-pressure chamber 101. In particular, the deposition apparatus 100F further includes the valve 102 disposed between the chamber 110 and the low-pressure chamber 101. During the deposition process, the valve 102 is turned off. After the deposition process is completely performed, the valve 102 is turned on to communicate the chamber 110 and the low-pressure chamber 101 and generate the pumping airflow 40 in the first direction D1 to quickly purge the unnecessary part of the first precursor 20 and the unnecessary part of the second precursor 30 from the chamber 110.

Figure 1H:
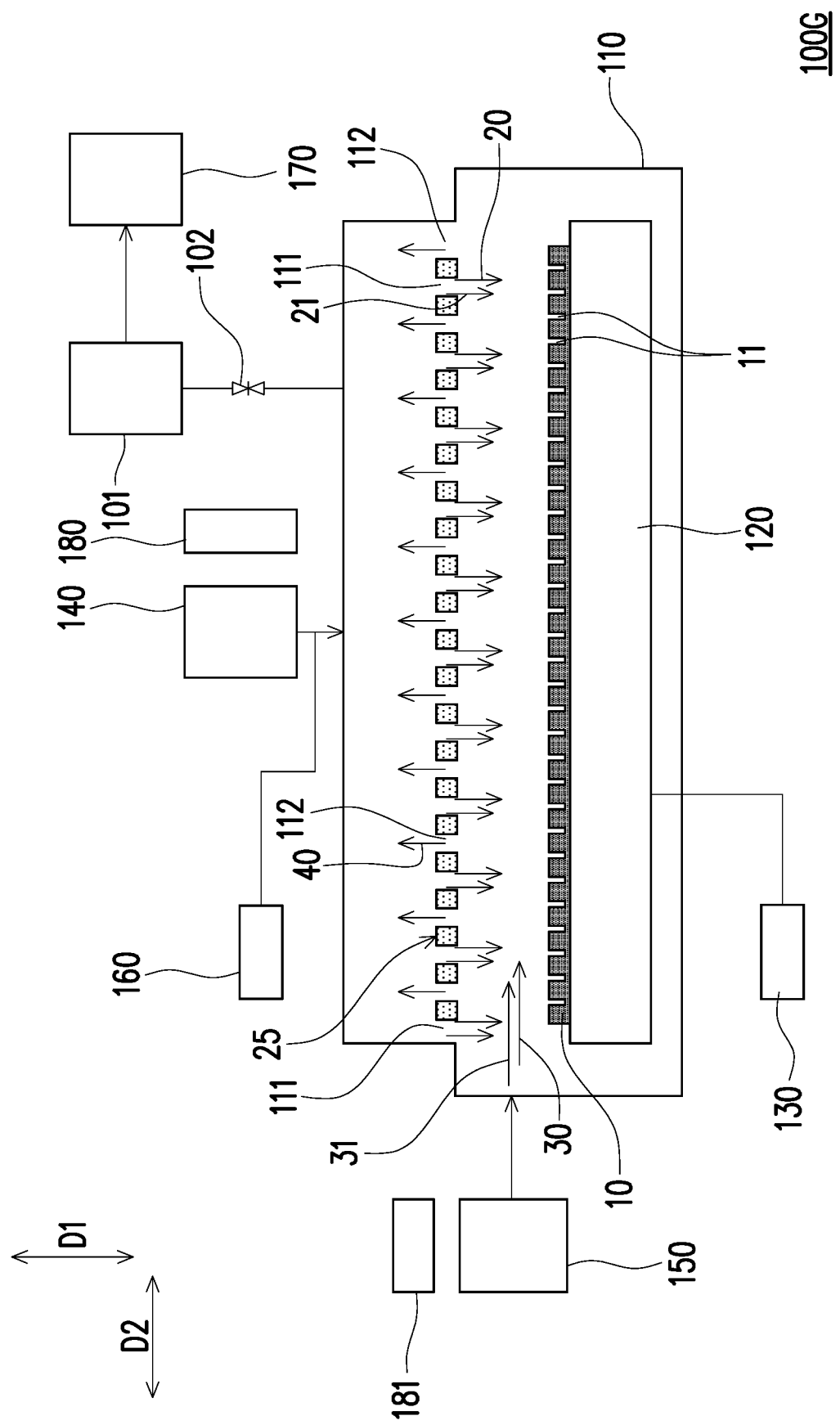

With reference to FIG. 1H, which is a schematic diagram of the deposition apparatus according to an eighth embodiment, a difference between a deposition apparatus 100G and the deposition apparatus 100F provided in the seventh embodiment depicted FIG. 1G lies in that the deposition apparatus 100G further includes the first heater 180 thermally coupled to the first injection device 140 and the second heater 181 thermally coupled to the second injection device 150. The deposition apparatus 100G includes the low-pressure chamber 101 connected to the chamber 110, and when the first precursor 20 is injected into the chamber 110, the first heater 180 is turned on and heats the first precursor 20 to provide energy required for the reaction of the first precursor 20. In addition, when the second precursor 30 is injected into the chamber 110, the second heater 181 is turned on and heats the second precursor 30 to provide the energy required for the reaction of the second precursor 30.

Figure 2E:
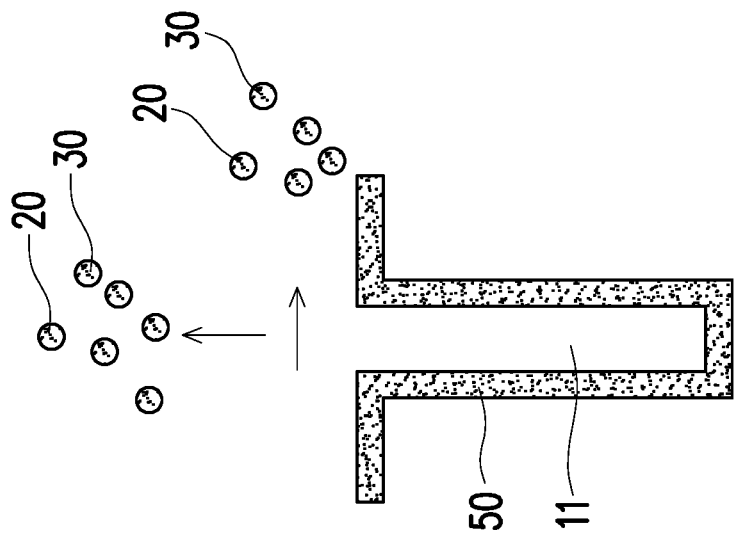
Figure 2D:
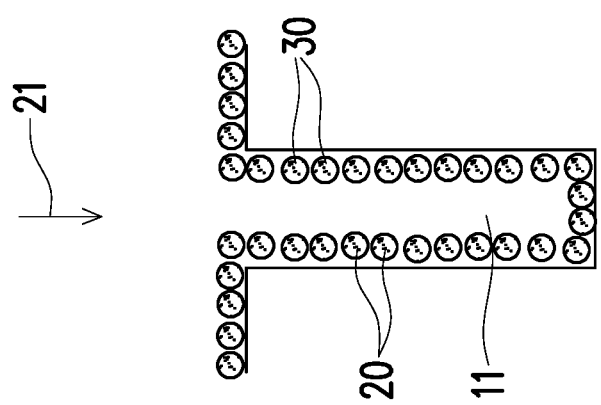

FIG. 2A to FIG. 2E are schematic partial enlarged views of a deposition process on a high aspect ratio structure according to an embodiment of the disclosure. With reference to FIG. 1A and FIG. 2A, first, the first precursor 20 is evenly injected into the chamber 110 along the first direction D1 through the shower head 25 and flows toward the substrate 10. Next, as shown in FIG. 2B, the second inert gas 31 is injected into the chamber 110 along the second direction D2 to purge or clear the first precursor 20 blocked in the openings of the high aspect ratio structures 11, so that the first precursor 20 may fall into the high aspect ratio structures 11 smoothly, as shown in FIG. 2A and FIG. 2B. Next, with reference to FIG. 1A and FIG. 2C, the second precursor 30 is injected into the chamber 110 along the second direction D2 and flows through the substrate 10. Then, as shown in FIG. 2D, the first inert gas 21 is evenly injected into the chamber 110 along the first direction D1 through the shower head 25 and flows toward the substrate 10 to accelerate the speed at which the second precursor 30 falls into the high aspect ratio structures 11 and is spread over the inner wall surfaces of the high aspect ratio structures 11, as shown in FIG. 2C and FIG. 2D. Finally, a thin film 50 with a conformal uniform thickness is formed in the high aspect ratio structures 11, and the unnecessary part of the first precursor 20 and the unnecessary part of the second precursor 30 and by-products are purged, as shown in FIG. 2E.

Figure 3A:
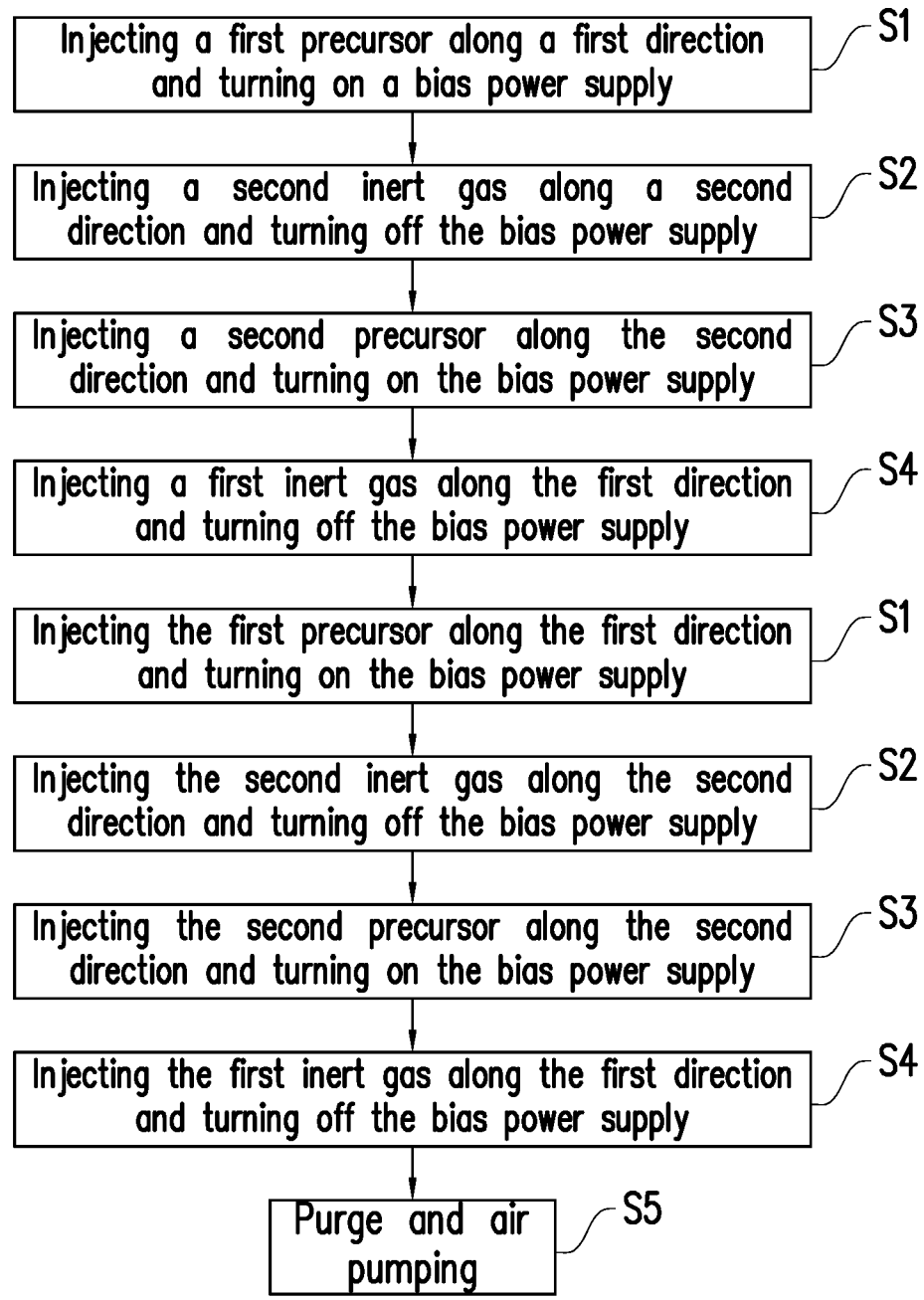
FIG. 3A is a schematic flowchart of a deposition method according to the first embodiment of the disclosure.
Figure 3B:
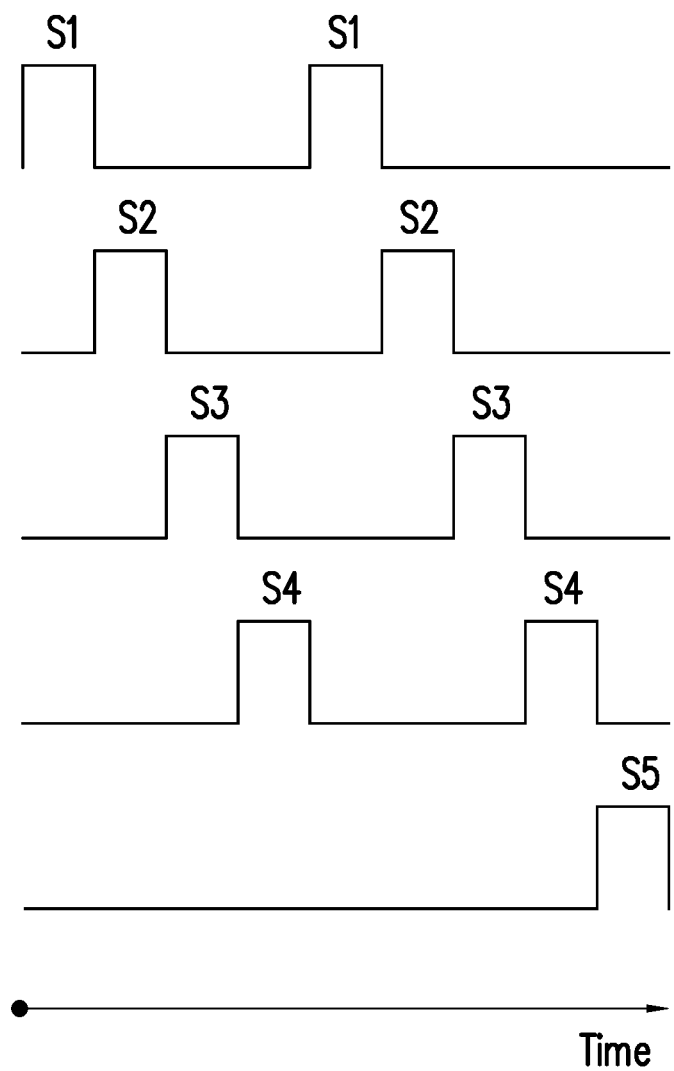
FIG. 3B is a schematic time sequence diagram illustrating the deposition method depicted in FIG. 3A.

FIG. 3A is a schematic flowchart of a deposition method according to the first embodiment of the disclosure. FIG. 3B is a schematic time sequence diagram illustrating the deposition method depicted in FIG. 3A. With reference to FIG. 3A and FIG. 3B, the deposition method may be performed by any of the deposition apparatus 100 and the deposition apparatuses 100A to 100G.

Specifically, the deposition method provided in the first embodiment includes the first reaction step and the second reaction step, as shown in FIG. 3A and FIG. 3B, where:
  in the first reaction step, the first half-reaction step S1 (injecting the first precursor 20 along the first direction D1 and turning on the bias power supply 130) and the second purge step S2 (injecting the second inert gas 31 along the second direction D2 and turning off the bias power supply 130) are sequentially performed;
  in the second reaction step, the second half-reaction S3 (injecting the second precursor 30 along the second direction D2 and turning on the bias power supply 130) and the first purge step S4 (injecting the first inert gas 21 along the first direction D1 and turning off the bias power supply 130) are sequentially performed.

As shown in FIG. 3A and FIG. 3B, the deposition method provided in the first embodiment of the disclosure includes alternately performing the first reaction step and the second reaction step twice. That is, the first half-reaction step S1, the second purge step S2, the second half-reaction step S3, and the first purge step S4 are sequentially performed, and the first half-reaction step S1, the second purge step S2, the second half-reaction step S3, and the first purge step S4 are sequentially performed again. Finally, purge and air pumping steps are performed (i.e., a cleaning step S5). In the cleaning step S5, an inert gas (e.g., the first inert gas 21 or the second inert gas 31) is injected to purge the unnecessary part of the first precursor 20, the unnecessary part of the second precursor 30, or other by-products, and the air pumping step is performed on the chamber 110 to pump out the unnecessary part of the first precursor 20, the unnecessary part of the second precursor 30, or other by-products from the chamber 110. Here, the cleaning step S5 may be omitted and should not be construed as a limitation in the disclosure.

Figure 4A:
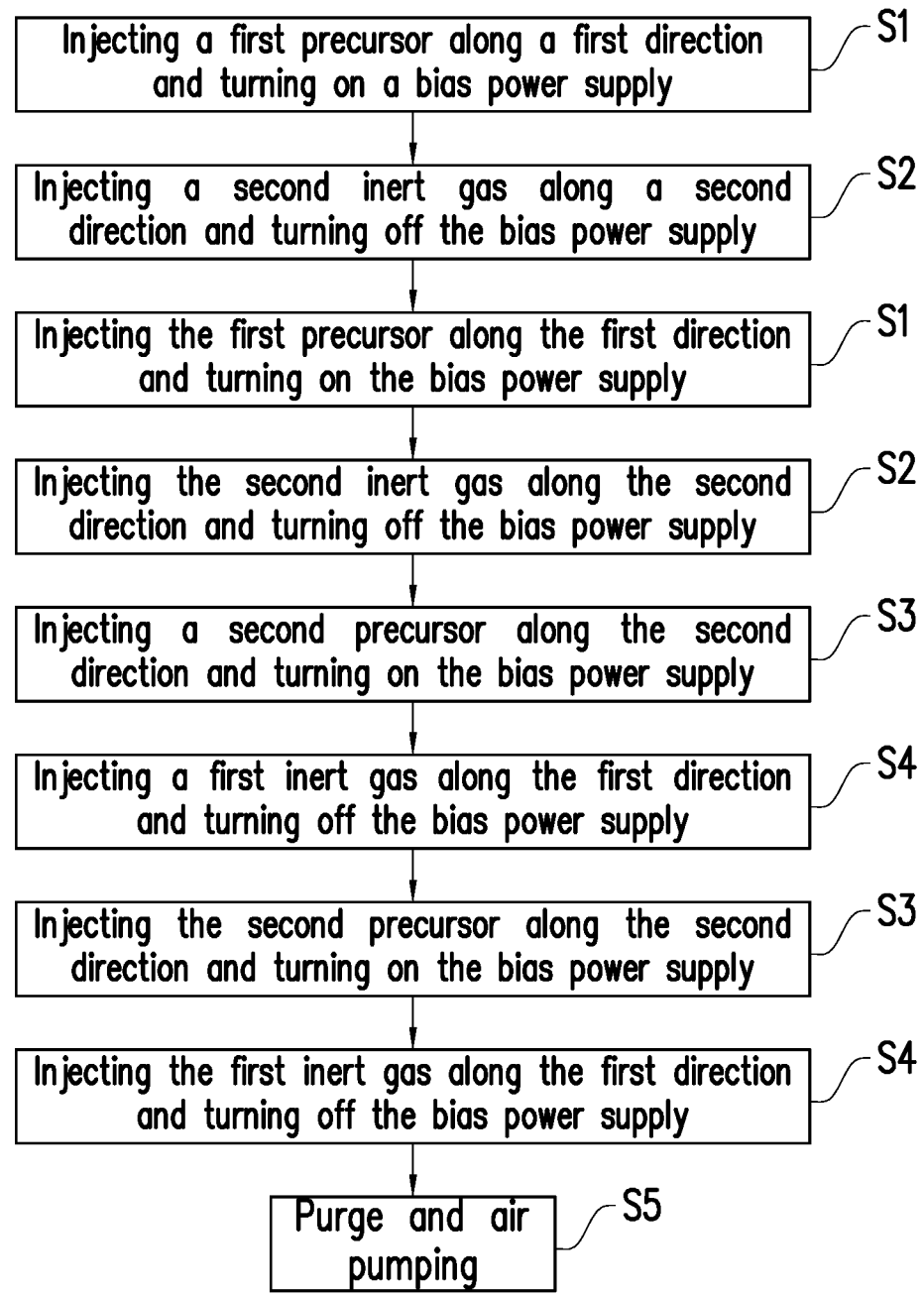
FIG. 4A is a schematic flowchart of a deposition method according to the second embodiment of the disclosure.
Figure 4B:
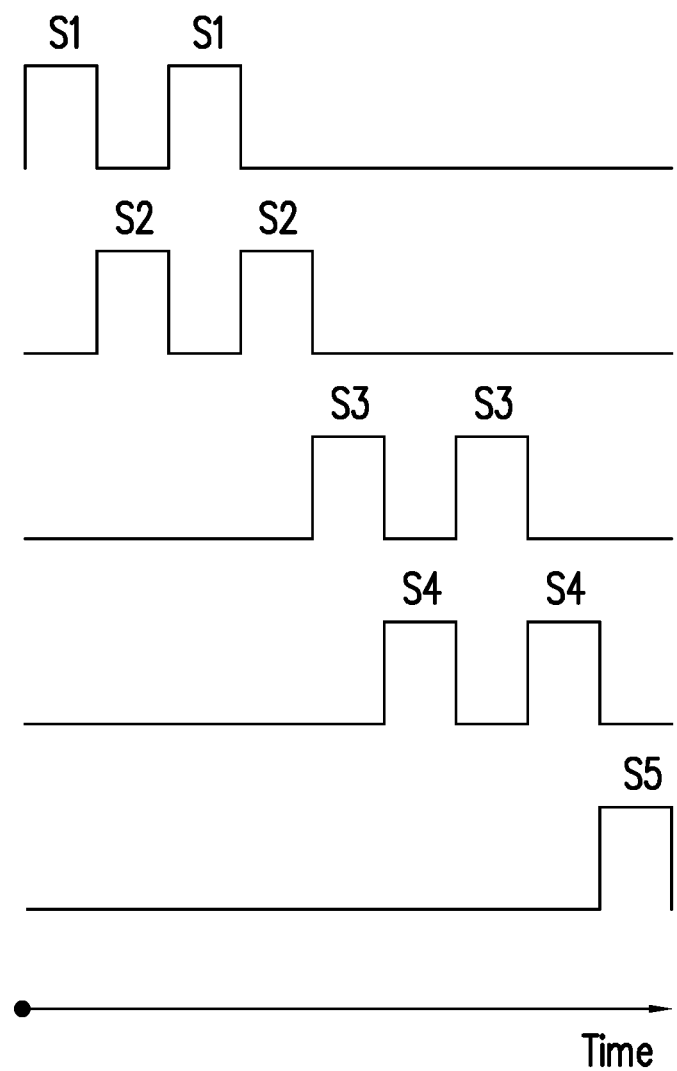
FIG. 4B is a schematic time sequence diagram illustrating the deposition method depicted in FIG. 4A.

FIG. 4A is a schematic flowchart of a deposition method according to the second embodiment of the disclosure. FIG. 4B is a schematic time sequence diagram illustrating the deposition method depicted in FIG. 4A. With reference to FIG. 4A and FIG. 4B, the deposition method may be performed by any of the deposition apparatus 100 and the deposition apparatuses 100A to 100G.

Specifically, the deposition method provided in the second embodiment includes the first reaction step and the second reaction step, as shown in FIG. 4A and FIG. 4B, where:
  in the first reaction step, the first half-reaction step S1 (injecting the first precursor 20 along the first direction D1 and turning on the bias power supply 130) and the second purge step S2 (injecting the second inert gas 31 along the second direction D2 and turning off the bias power supply 130) are sequentially performed;
  in the second reaction step, the second half-reaction S3 (injecting the second precursor 30 along the second direction D2 and turning on the bias power supply 130) and the first purge step S4 (injecting the first inert gas 21 along the first direction D1 and turning off the bias power supply 130) are sequentially performed.

As shown in FIG. 4A and FIG. 4B, the deposition method provided in the second embodiment of the disclosure includes performing the first reaction step twice and then performing the second reaction step twice. That is, the first half-reaction step S1, the second purge step S2, the first half-reaction step S1, and the second purge step S2 are sequentially performed, and the second half-reaction step S3, the first purge step S4, the second half-reaction step S3, and the first purge step S4 are sequentially performed. Finally, the purge and air pumping steps are performed (i.e., a cleaning step S5). In the cleaning step S5, an inert gas (e.g., the first inert gas 21 or the second inert gas 31) is injected to purge the unnecessary part of the first precursor 20, the unnecessary part of the second precursor 30, or other by-products, and the air pumping step is performed on the chamber 110 to pump out the unnecessary part of the first precursor 20, the unnecessary part of the second precursor 30, and/or other by-products from the chamber 110. Here, the cleaning step S5 may be omitted and should not be construed as a limitation in the disclosure.

Figure 5A:
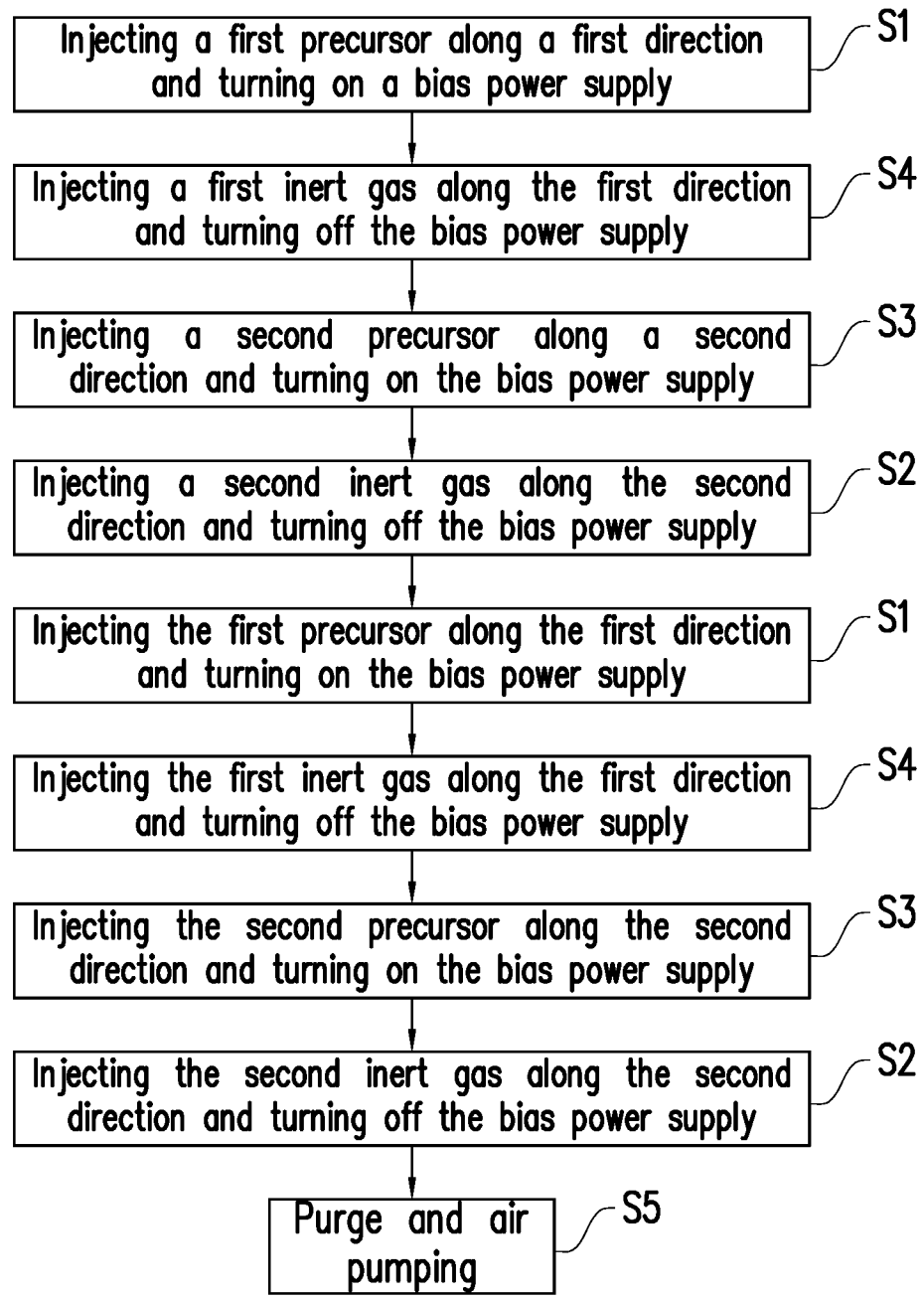
FIG. 5A is a schematic flowchart of a deposition method according to the third embodiment of the disclosure.
Figure 5B:
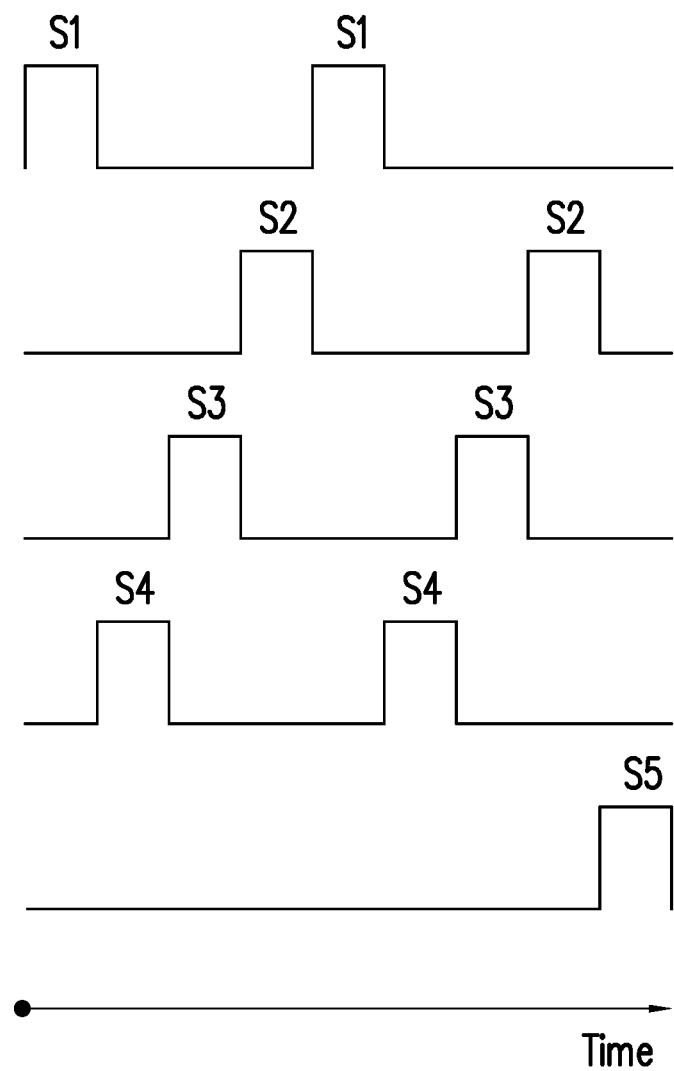
FIG. 5B is a schematic time sequence diagram illustrating the deposition method depicted in FIG. 5A.

FIG. 5A is a schematic flowchart of a deposition method according to the third embodiment of the disclosure. FIG. 5B is a schematic time sequence diagram illustrating the deposition method depicted in FIG. 5A. With reference to FIG. 5A and FIG. 5B, the deposition method may be performed by any of the deposition apparatus 100 and the deposition apparatuses 100A to 100G.

Specifically, the deposition method provided in the third embodiment includes the first reaction step and the second reaction step, as shown in FIG. 5A and FIG. 5B, where:
  in the first reaction step, the first half-reaction step S1 (injecting the first precursor 20 along the first direction D1 and turning on the bias power supply 130) and the first purge step S4 (injecting the first inert gas 21 along the first direction D1 and turning off the bias power supply 130) are sequentially performed;
  in the second reaction step, the second half-reaction S3 (injecting the second precursor 30 along the second direction D2 and turning on the bias power supply 130) and the second purge step S2 (injecting the second inert gas 31 along the second direction D2 and turning off the bias power supply 130) are sequentially performed.

As shown in FIG. 5A and FIG. 5B, the deposition method provided in the third embodiment of the disclosure includes alternately performing the first reaction step and the second reaction step twice. That is, the first half-reaction step S1, the first purge step S4, the second half-reaction step S3, and the second purge step S2 are sequentially performed, and the first half-reaction step S1, the first purge step S4, the second half-reaction step S3, and the second purge step S2 are sequentially performed again. Finally, the purge and air pumping steps are performed (i.e., a cleaning step S5). In the cleaning step S5, an inert gas (e.g., the first inert gas 21 or the second inert gas 31) is injected to purge the unnecessary part of the first precursor 20, the unnecessary part of the second precursor 30, or other by-products, and the air pumping step is performed on the chamber 110 to pump out the unnecessary part of the first precursor 20, the unnecessary part of the second precursor 30, and/or other by-products from the chamber 110. Here, the cleaning step S5 may be omitted and should not be construed as a limitation in the disclosure.

Figure 6A:
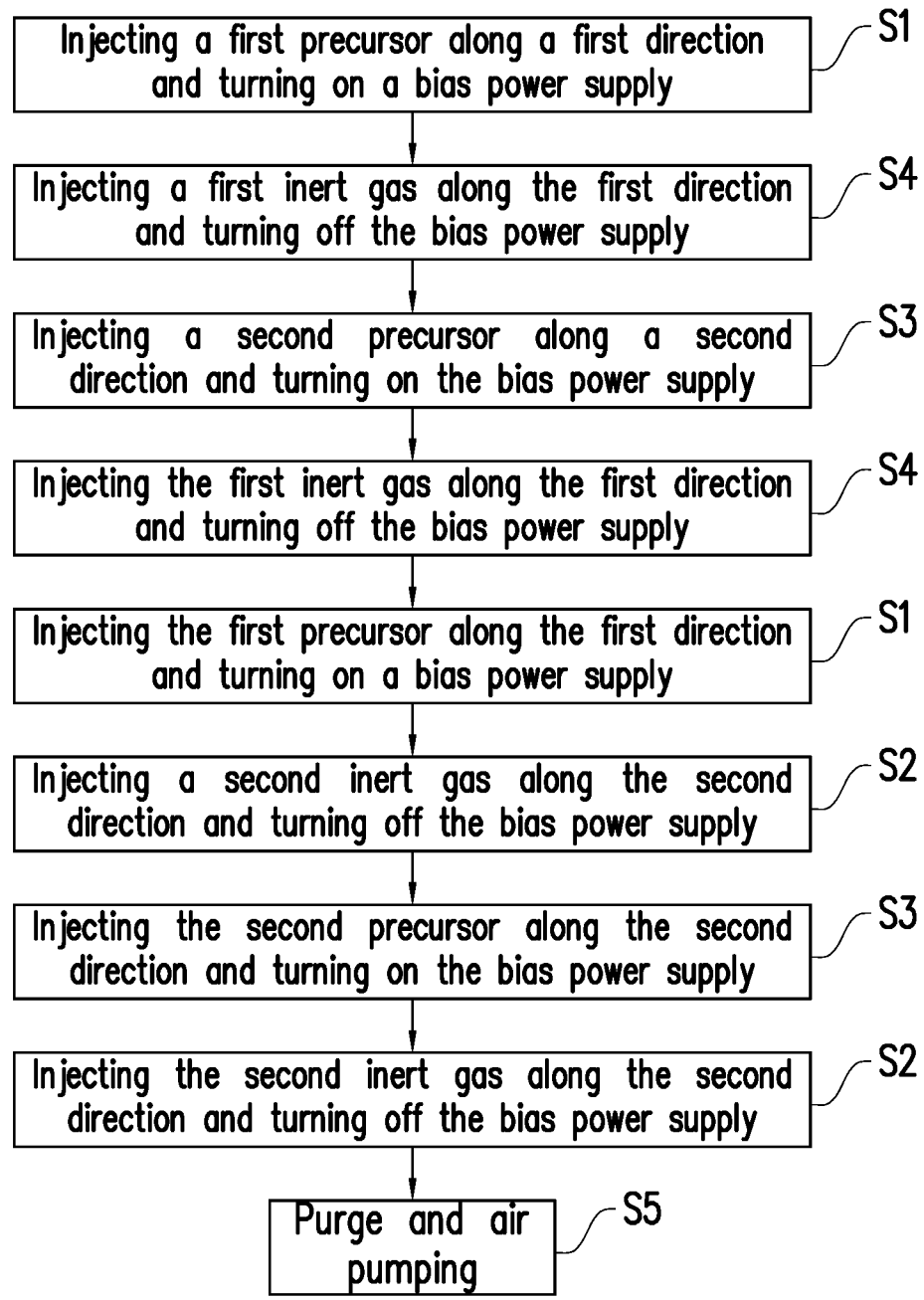
FIG. 6A is a schematic flowchart of a deposition method according to the fourth embodiment of the disclosure.
Figure 6B:
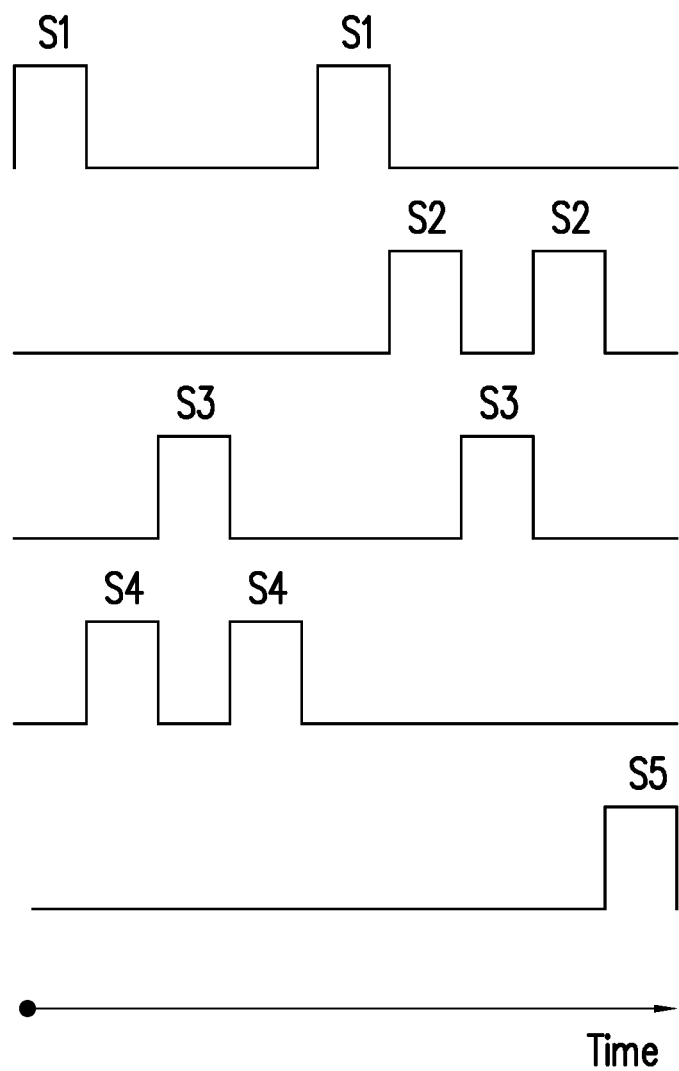
FIG. 6B is a schematic time sequence diagram illustrating the deposition method depicted in FIG. 6A.

FIG. 6A is a schematic flowchart of a deposition method according to the fourth embodiment of the disclosure. FIG. 6B is a schematic time sequence diagram illustrating the deposition method depicted in FIG. 6A. The deposition method may be performed by any of the deposition apparatus 100 and the deposition apparatuses 100A to 100G.

Specifically, the deposition method provided in the fourth embodiment includes the first reaction step to the fourth reaction step, as shown in FIG. 6A and FIG. 6B, where:

in the first reaction step, the first half-reaction step S1 (injecting the first precursor 20 along the first direction D1 and turning on the bias power supply 130) and the first purge step S4 (injecting the first inert gas 21 along the first direction D1 and turning off the bias power supply 130) are sequentially performed;

in the second reaction step, the second half-reaction S3 (injecting the second precursor 30 along the second direction D2 and turning on the bias power supply 130) and the first purge step S4 are sequentially performed;

in the third reaction step, the first half-reaction step S1 and the second purge step S2 (injecting the second inert gas 31 along the second direction D2 and turning off the bias power supply 130) are sequentially performed;

in the fourth reaction step, the second half-reaction S3 and the second purge step S2 are sequentially performed.

The deposition method provided in the fourth embodiment of the disclosure includes sequentially performing the first reaction step to the fourth reaction step. As shown in FIG. 6B, the first half-reaction step S1 and the first purge step S4 are sequentially performed, the second half-reaction S3 and the first purge step S4 are performed, the first half-reaction step S1 and the second purge step S2 are performed, and then the second half-reaction S3 and the second purge step S2 are performed. Finally, the purge and air pumping steps are performed (i.e., a cleaning step S5). In the cleaning step S5, an inert gas (e.g., the first inert gas 21 or the second inert gas 31) is injected to purge the unnecessary part of the first precursor 20, the unnecessary part of the second precursor 30, or other by-products, and the air pumping step is performed on the chamber 110 to pump out the unnecessary part of the first precursor 20, the unnecessary part of the second precursor 30, and/or other by-products from the chamber 110. Here, the cleaning step S5 may be omitted and should not be construed as a limitation in the disclosure.

Figure 7A:
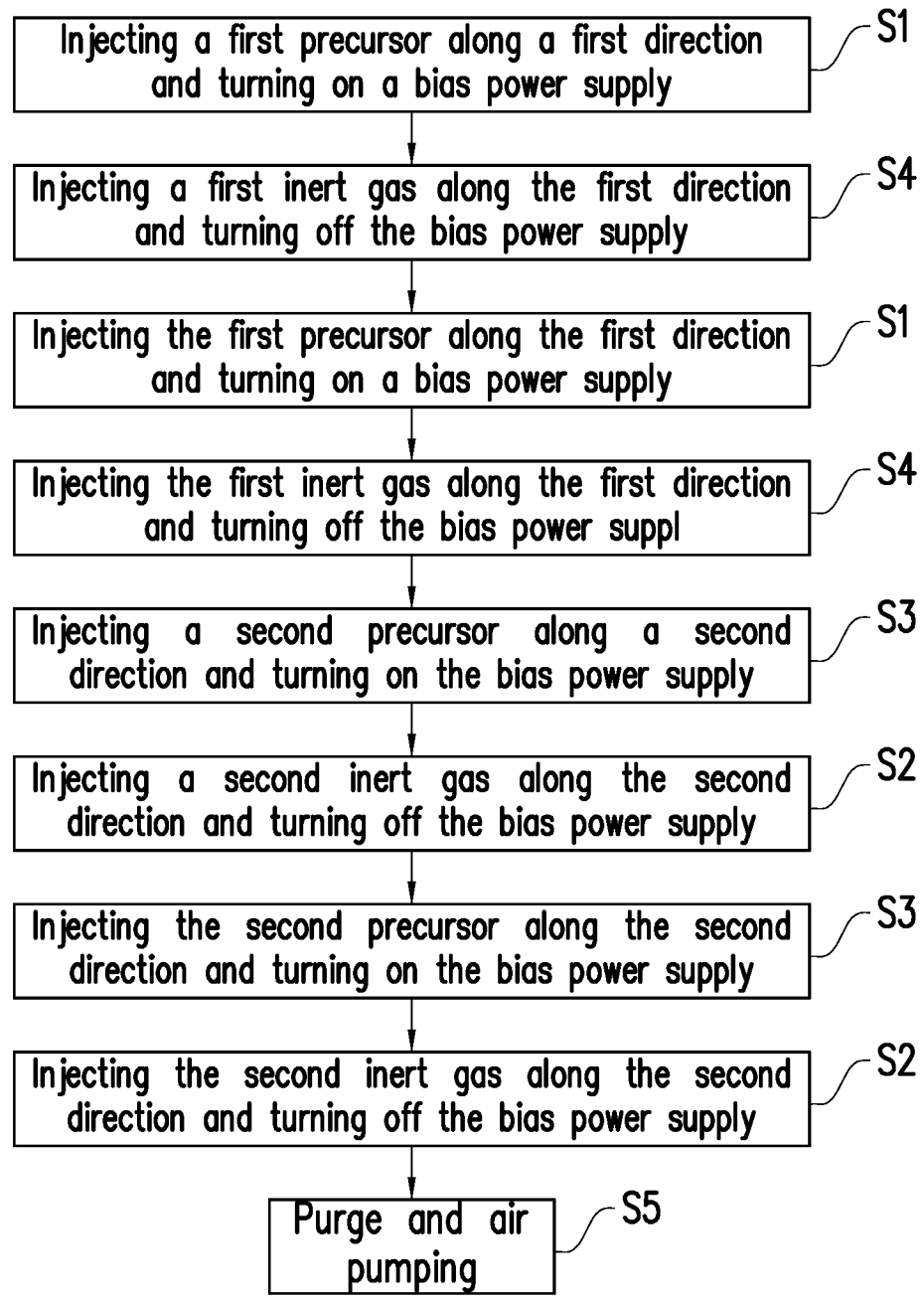
FIG. 7A is a schematic flowchart of a deposition method according to the fifth embodiment of the disclosure.
Figure 7B:
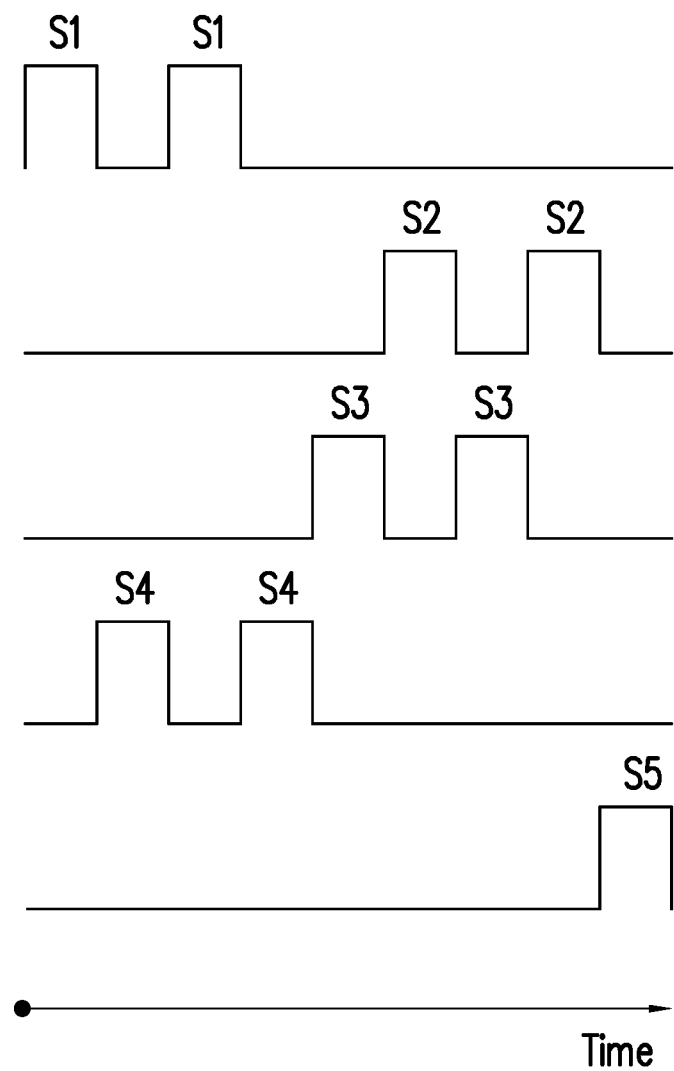
FIG. 7B is a schematic time sequence diagram illustrating the deposition method depicted in FIG. 7A.

FIG. 7A is a schematic flowchart of a deposition method according to the fifth embodiment of the disclosure. FIG. 7B is a schematic time sequence diagram illustrating the deposition method depicted in FIG. 7A.

Specifically, the deposition method provided in the fifth embodiment includes the first reaction step and the second reaction step, as shown in FIG. 7A and FIG. 7B, where:

in the first reaction step, the first half-reaction step S1 (injecting the first precursor 20 along the first direction D1 and turning on the bias power supply 130) and the first purge step S4 (injecting the first inert gas 21 along the first direction D1 and turning off the bias power supply 130) are sequentially performed;

in the second reaction step, the second half-reaction S3 (injecting the second precursor 30 along the second direction D2 and turning on the bias power supply 130) and the second purge step S2 (injecting the second inert gas 31 along the second direction D2 and turning off the bias power supply 130) are sequentially performed.

The deposition method provided in the fifth embodiment of the disclosure includes performing the first reaction step twice and then performing the second reaction step twice. As shown in FIG. 7B, the first half-reaction step S1, the first purge step S4, the first half-reaction step S1, and the first purge step S4 are sequentially performed, and then the second half-reaction step S3, the second purge step S2, the second half-reaction step S3, and the second purge step S2 are sequentially performed. Finally, the purge and air pumping steps are performed (i.e., a cleaning step S5). In the cleaning step S5, an inert gas (e.g., the first inert gas 21 or the second inert gas 31) is injected to purge the unnecessary part of the first precursor 20, the unnecessary part of the second precursor 30, and/or other by-products, and the air pumping step is performed on the chamber 110 to pump out the unnecessary part of the first precursor 20, the unnecessary part of the second precursor 30, and/or other by-products from the chamber 110. Here, the cleaning step S5 may be omitted and should not be construed as a limitation in the disclosure.

To sum up, in the deposition apparatus and the deposition method provided in the disclosure, the first precursor and the second precursor are injected into the chamber along two directions perpendicular to each other, where the first precursor forms the down stream flowing toward the substrate (e.g., the vertical direction), and then the second precursor forms the cross flow flowing through the substrate (e.g., the horizontal direction). The alternate action of the down stream and the cross flow is not only conducive to acceleration of the growth rate of the thin film in the vertical direction but also conducive to improvement of the uniformity of the thin film formed in the high aspect ratio structures. In another aspect, during the alternate action of the down stream and the cross flow, the bias power supply is turned on, and the bias is applied to the platform and the substrate thereon. Under the bias action, the first and second precursors are attracted to the substrate and moved into the high aspect ratio structures, which is conducive to the improvement of the coating efficiency and uniformity.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. An atomic layer deposition method comprising:
    injecting a first precursor into a chamber along a first direction and turning on a bias power supply to attract the first precursor to a substrate;
    injecting a second precursor into the chamber along a second direction perpendicular to the first direction and turning on the bias power supply to attract the second precursor to the substrate;
    injecting a first inert gas into the chamber along the first direction and turning off the bias power supply to purge an unnecessary part of the first precursor or an unnecessary part of the second precursor or by-products; and injecting a second inert gas into the chamber along the second direction and turning off the bias power supply to purge the unnecessary part of the first precursor or the unnecessary part of the second precursor or the by-products.

2. The deposition method according to claim 1, wherein a first reaction step is performed by sequentially injecting the first precursor into the chamber and injecting the second inert gas into the chamber, a second reaction step is performed by sequentially injecting the second precursor into the chamber and injecting the first inert gas into the chamber; and the first reaction step and the second step are alternately performed twice.

3. The deposition method according to claim 1, wherein a first reaction step is performed by sequentially injecting the first precursor into the chamber and injecting the second inert gas into the chamber, a second reaction step is performed by sequentially injecting the second precursor into the chamber and injecting the first inert gas into the chamber; and the first reaction step is performed twice, and then the second reaction step is performed twice.

4. The deposition method according to claim 1, wherein a first reaction step is performed by sequentially injecting the first precursor into the chamber and injecting the first inert gas into the chamber, a second reaction step is performed by sequentially injecting the second precursor into the chamber and injecting the second inert gas into the chamber; and the first reaction step and the second step are alternately performed twice.

5. The deposition method according to claim 1, wherein a first reaction step is performed by sequentially injecting the first precursor into the chamber and injecting the first inert gas into the chamber, a second reaction step is performed by sequentially injecting the second precursor into the chamber and injecting the first inert gas into the chamber, a third reaction step is performed by sequentially injecting the first precursor into the chamber and injecting the second inert gas into the chamber, a fourth reaction step is performed by sequentially injecting the second precursor into the chamber and injecting the second inert gas into the chamber; and the first reaction step to the fourth reaction step are sequentially performed.

6. The deposition method according to claim 1, wherein a first reaction step is performed by sequentially injecting the first precursor into the chamber and injecting the first inert gas into the chamber, a second reaction step is performed by sequentially injecting the second precursor into the chamber and injecting the second inert gas into the chamber; and the first reaction step is performed twice, and then the second reaction step is performed twice.

7. The deposition method according to claim 1, further comprising:

generating a pumping airflow to the chamber in the first direction or the second direction to pump out the unnecessary part of the first precursor or the unnecessary part of the second precursor from the chamber.

8. The deposition method according to claim 1, further comprising:

heating the first precursor; and
heating the second precursor.

9. The deposition method according to claim 1, further comprising:

turning on a radio frequency power supply to accelerate a reaction of the first precursor.

\* \* \* \* \*